(12) United States Patent
Hsieh et al.

(10) Patent No.: US 12,154,813 B2
(45) Date of Patent: Nov. 26, 2024

(54) ELECTROSTATIC CHUCK SIDEWALL GAS CURTAIN

(71) Applicant: Taiwan Semiconductor Manufacturing Co., Ltd., Hsinchu (TW)

(72) Inventors: Ian Hsieh, Hsinchu (TW); Che-fu Chen, Taipei (TW); Yan-Hong Liu, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/051,544

(22) Filed: Nov. 1, 2022

(65) Prior Publication Data
US 2023/0078610 A1   Mar. 16, 2023

Related U.S. Application Data

(63) Continuation of application No. 16/445,336, filed on Jun. 19, 2019, now Pat. No. 11,521,884.

(60) Provisional application No. 62/692,128, filed on Jun. 29, 2018.

(51) Int. Cl.
*H01L 21/683* (2006.01)
*H01J 37/32* (2006.01)

(52) U.S. Cl.
CPC .... *H01L 21/6833* (2013.01); *H01J 37/32449* (2013.01); *H01J 37/32724* (2013.01); *H01J 37/32816* (2013.01); *H01J 2237/3341* (2013.01)

(58) Field of Classification Search
CPC ............ H01L 21/6833; H01J 37/32449; H01J 37/32724
See application file for complete search history.

(56) References Cited

U.S. PATENT DOCUMENTS

| | | | |
|---|---|---|---|
| 5,343,938 A * | 9/1994 | Schmidt | H01L 21/68785 118/728 |
| 5,551,983 A * | 9/1996 | Shepard, Jr. | C23C 16/4584 118/728 |
| 6,702,900 B2 | 3/2004 | Yeh et al. | |
| 7,722,719 B2 | 5/2010 | Lei et al. | |
| 8,520,360 B2 | 8/2013 | Singh | |
| 9,214,373 B2 * | 12/2015 | Hsu | H01L 21/6831 |
| 10,157,755 B2 * | 12/2018 | Chandrasekharan | C23C 16/45519 |
| 2002/0134514 A1 | 9/2002 | Yeh et al. | |
| 2006/0219176 A1 * | 10/2006 | Tomita | H05B 3/143 118/725 |

(Continued)

FOREIGN PATENT DOCUMENTS

| CN | 101197249 A | 6/2008 |
|---|---|---|
| CN | 102034666 A | 4/2011 |

(Continued)

*Primary Examiner* — Scott Bauer
(74) *Attorney, Agent, or Firm* — Sterne, Kessler, Goldstein & Fox P.L.L.C.

(57) ABSTRACT

The present disclosure describes an apparatus. The apparatus includes a chuck for placing an object thereon, a gas passage extending along a periphery of an outer sidewall of the chuck and separating the chuck into an inner portion and a sidewall portion, and a plurality of gas holes through the sidewall portion and configured to connect a gas external to the chuck to the gas passage.

20 Claims, 6 Drawing Sheets

(56) References Cited

U.S. PATENT DOCUMENTS

| | | | |
|---|---|---|---|
| 2010/0202860 A1* | 8/2010 | Reed | H01L 21/68742 |
| | | | 414/221 |
| 2010/0316800 A1 | 12/2010 | Chang et al. | |
| 2011/0079356 A1 | 4/2011 | Kim et al. | |
| 2016/0372308 A1 | 12/2016 | Murakami et al. | |
| 2017/0069471 A1 | 3/2017 | Seok et al. | |
| 2017/0243777 A1 | 8/2017 | Ohashi et al. | |
| 2020/0118836 A1 | 4/2020 | Ding | |

FOREIGN PATENT DOCUMENTS

| | | |
|---|---|---|
| CN | 107452612 A | 12/2017 |
| JP | 2008258491 A | 10/2008 |

\* cited by examiner

ELECTROSTATIC CHUCK SIDEWALL GAS CURTAIN

CROSS-REFERENCE TO RELATED APPLICATION

This application is a continuation application of U.S. patent application Ser. No. 16/445,336, titled "Electrostatic Chuck Sidewall Gas Curtain," filed on Jun. 19, 2019, which claims the benefit of U.S. Provisional Patent Application No. 62/692,128, titled "Novel ESC Sidewall Air Curtain For Arcing Prevention," filed on Jun. 29, 2018, all of which are incorporated herein by reference in their entireties.

BACKGROUND

Electrostatic chucks (ESCs) are widely used in various semiconductor processes to hold a wafer during different operations, such as plasma-based etching, ion implantation, chemical vapor deposition (CVD), etc. An ESC includes a platen with integral electrodes. These electrodes are biased with a high voltage during operation to establish an electrostatic holding force between the platen and the object being held (e.g., the wafer). The portion of the ESC that provides the electrostatic holding force is referred to as a "chuck."

ESCs can be used in different systems, e.g., etching, ion implantation, and CVD systems. For example, in a dry etch system, an ESC is located in a chamber to hold the wafer to be etched. Reactive gases can be flown into the chamber and plasma can be generated over the wafer. Radicals/high-energy ions can be formed from the plasma and strike the wafer surface. The radicals/high-energy ions can collide with the wafer surface and remove portions of the wafer by knocking off and reacting with the material.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
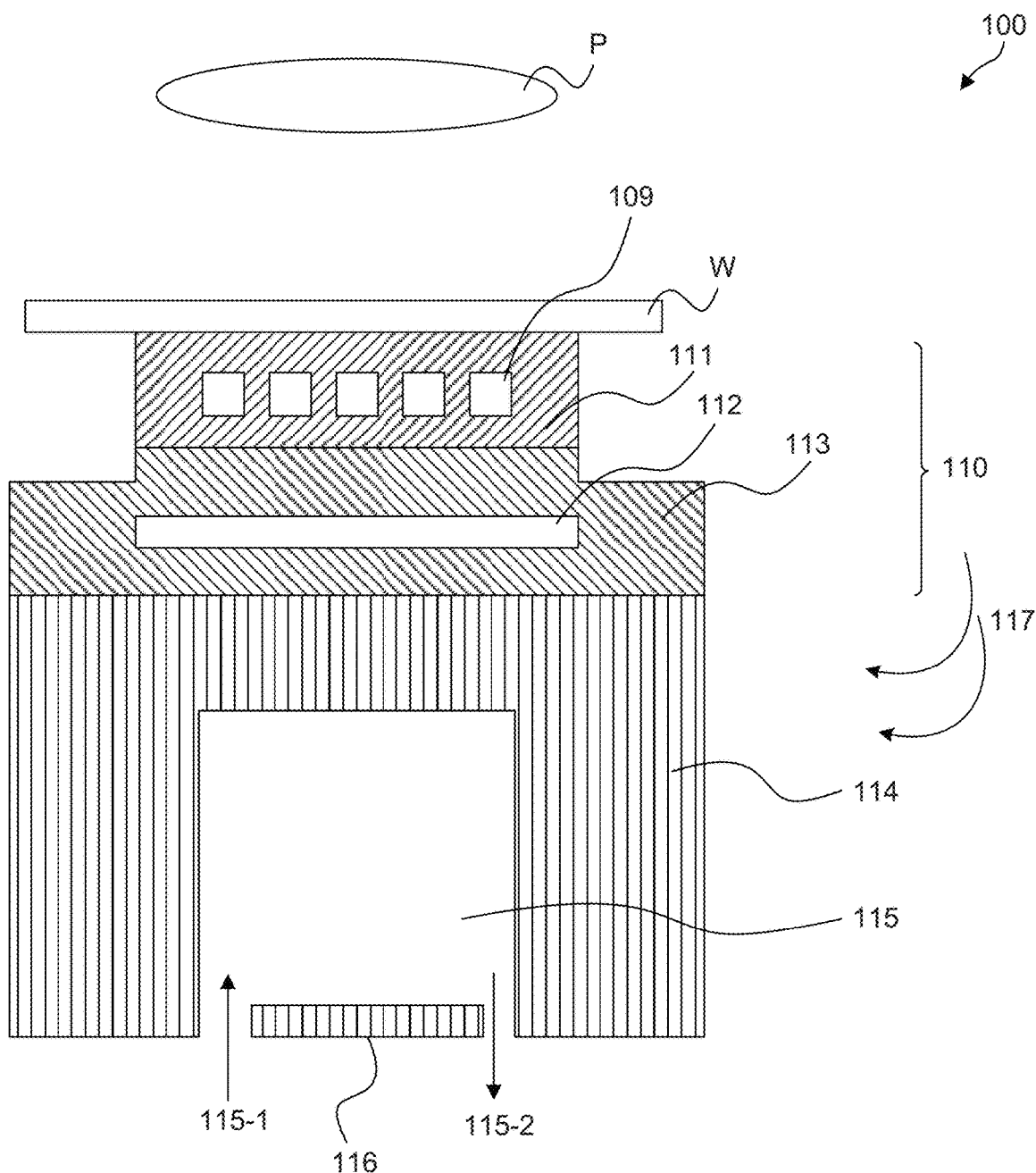
FIG. 1 illustrates a cross-sectional view of an electrostatic chuck.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In semiconductor fabrication, electrostatic chucks (ESCs) can be used in various systems, e.g., for holding/fixing, wafers. For example, an ESC can be used to hold a wafer in a chamber for a dry etch process. The wafer can be placed over the ESC, and etchant gases can be flown into the chamber. Under a radio frequency (RF) power, radicals/high-energy ions can be formed by ionizing the gas atoms and a plasma can be formed over the wafer. The radicals can bombard the wafer at a high kinetic energy and can remove desired portions of the water.

However, the plasma radicals can also collide with objects positioned adjacent to the ESC (or wafer) and deflect off these objects. The objects can be anything, e.g., a part of the chamber or other tools for processing the wafer. The deflected radicals can bombard and react with the outer sidewall of the ESC, causing damage to the ESC over time. The erosion can impair the outer sidewall (e.g., or the protective coating over the outer sidewall) of the ESC. The damaged outer sidewall can cause static electricity, which can cause the wafer to bow. As a result, the wafer can be damaged, thus impairing product yield.

FIG. 1 illustrates a wafer-holder structure 100 that carries a wafer W in a chamber for a dry etch process (e.g., wafer-holder structure 100 can be housed in a dry etch chamber). Plasma P is formed over wafer W. Wafer-holder structure 100 includes a base 114 and an ESC 110 over base 114. ESC 110 includes an electrode 109, a base platen 111, a heating component 112, and a heat insulating component 113. Electrode 109 can be embedded in base platen 111, and heating component 112 can be embedded in heat insulating component 113. Wafer-holder structure 100 can provide coulomb force and can attract and hold wafer W during the etch process. Heating component 112 can provide a suitable temperature for the etch process. Base 114 can further include a gas tunnel 115 for adjusting/controlling the processing temperature of wafer W. A heat transfer gas can circulate through gas tunnel 115 by flowing into inlet 115-1 and flowing out of outlet 115-2 to adjust the surface temperature of base platen 111. A base bottom 116 can seal the heat transfer gas and separate inlet 115-1 and outlet 115-2.

During the etch process, etchant gases can be flown into the chamber (e.g., from above wafer P). Under a high RF power, the etchant gases can be ionized and plasma P can be formed over wafer W. Radicals or high-energy ions formed from plasma P can strike the top surface of wafer P from various directions and react with the materials on the top surface of wafer W. Because a portion of the radicals can collide with objects that surround wafer-holder structure 100, the deflected radicals (labeled by arrows 117) can further collide with the outer sidewalls of ESC 110 and/or base 114. The kinetic energy of the radicals and the chemical reaction between the radical and the coating on the outer sidewalls can cause erosion to the coating over time. The loss of coating due to erosion can generate static electricity, which can cause wafer W to bow, thus resulting in a damaged wafer and lower yield.

The present disclosure provides an ESC structure and a method to prevent or reduce damage/erosion on the coating of an ESC's outer sidewall caused by radicals. The disclosed ESC structure employs a gas curtain to surround its outer sidewall, thus forming a barrier for the deflected radicals. The gas curtain prevents or reduces the amount of deflected radicals that reaches the ESC's outer sidewall, thus preventing or reducing erosion caused by the bombardment of the deflected radicals and the chemical reaction between the deflected radicals and the coating on the ESC's outer sidewall. The gas curtain can be formed by various ways, e.g., by forming gas passages along the periphery of the ESC structure and gas holes that connect the gas passages to a background gas external to the ESC structure and by flowing an inert gas into the gas passage. The background gas can include any gas (e.g., gas for chemical reaction, carrier gas, and plasma-generating gas) in the chamber where the ESC structure is located. The inert gas that exits from the gas holes can form a gas curtain that surrounds the ESC structure to prevent or reduce the deflected radicals from reaching the outer sidewall of the ESC structure. Because the inert gas is chemically stable during the dry etch, the etching of the wafer would not be affected by the gas curtain. The ESC structure is thus less susceptible to sidewall damage caused by plasma-based etching. Also, the wafer can be less susceptible to bowing caused by static electricity.

Figure 2A:
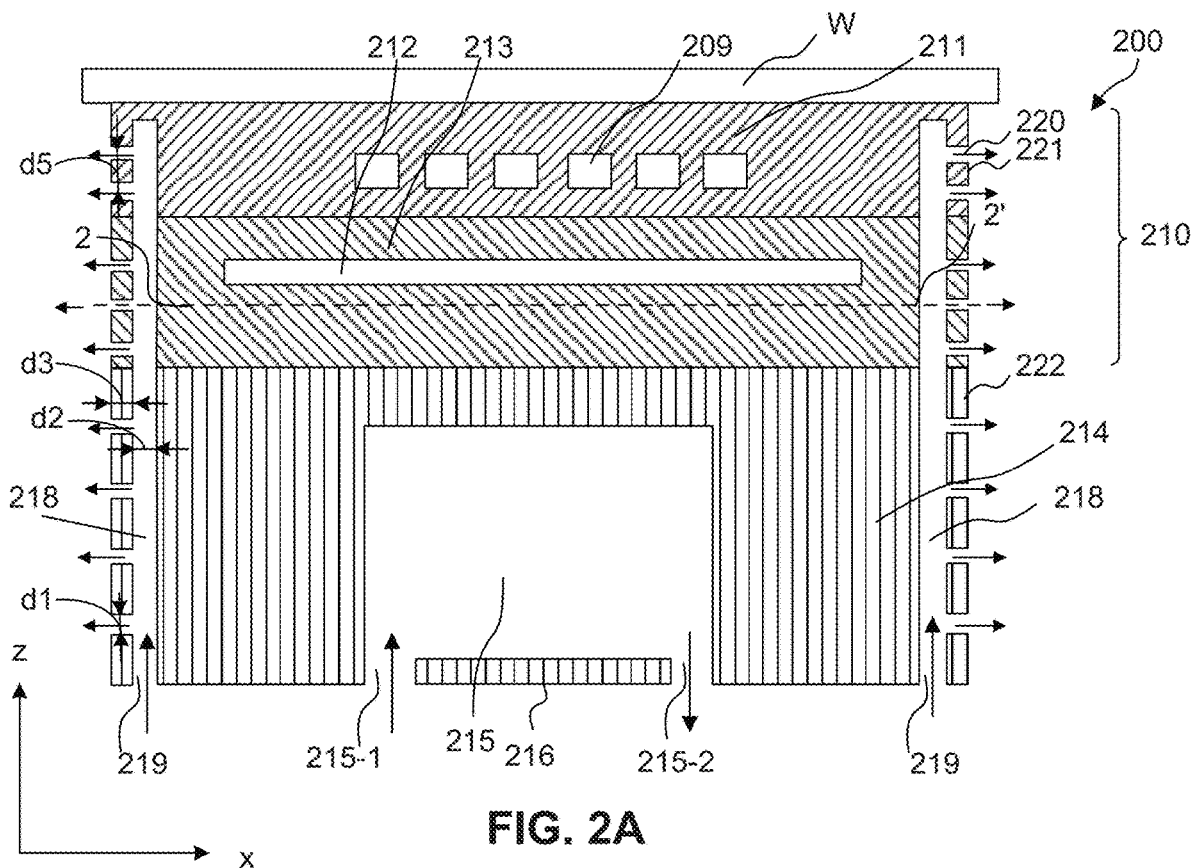
FIGS. 2A and 3A each illustrates a cross-sectional view of an electrostatic chuck structure, according to some embodiments of the present disclosure.
Figure 2B:
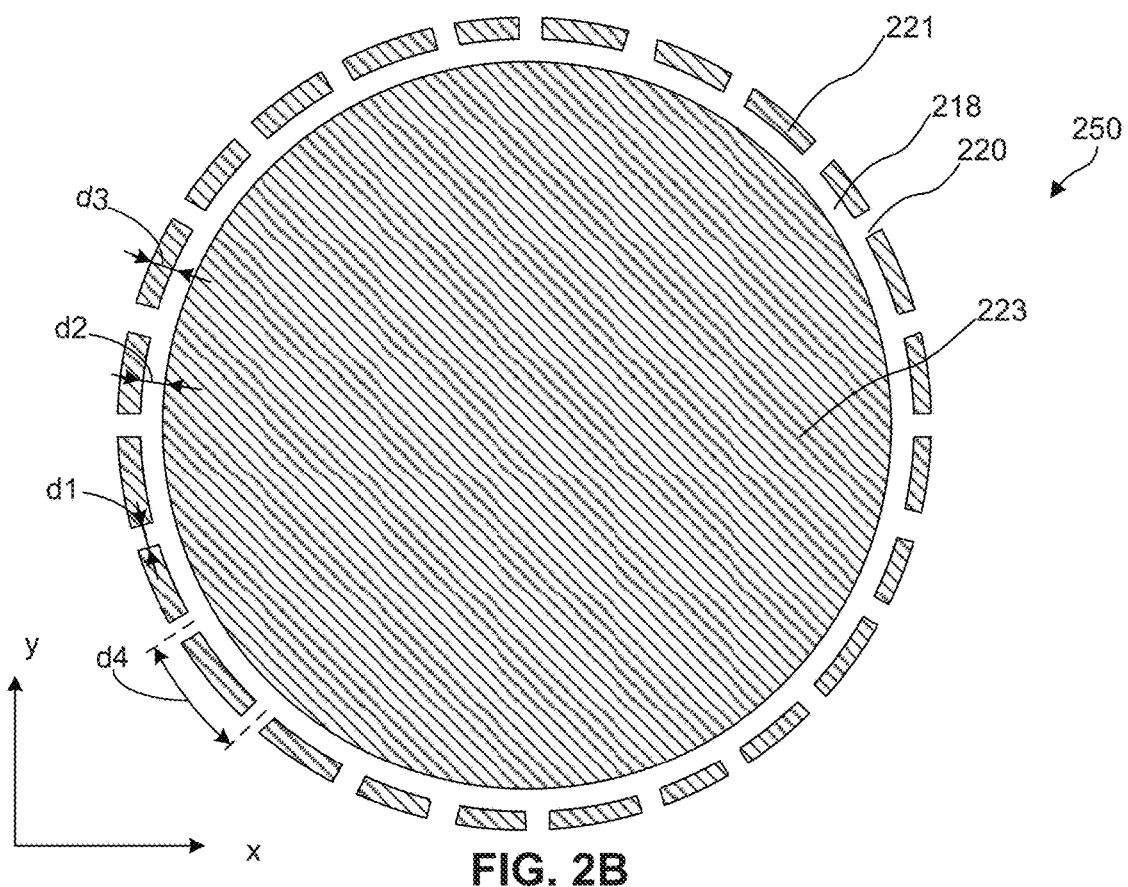
FIG. 2B is a top view of the electrostatic chuck structure illustrated in FIG. 2A along the 2-2' direction.

FIGS. 2A and 2B illustrate a wafer-holder structure, according to some embodiments. FIG. 2A illustrates a cross-sectional view 200 of the wafer-holder structure along the x-z plane, and FIG. 2B illustrates a top view 250 of the wafer-holder structure (along the 2-2' direction) along the x-y plane. The wafer-holder structure can include an ESC structure 210 and a base structure 214. Wafer W can be placed over ESC structure 210. ESC structure 210 can include a base platen 211, an electrode 209 embedded in base platen 211, a heat insulating component 213, and a heating component 212 embedded in heat insulating component 213. ESC structure 210 can be fixed on base structure 214. Base structure 214 can include a cooling component for adjusting the temperature of base platen 211, where wafer W is placed. In some embodiments, the cooling component includes a gas tunnel 215 that allows a heat transfer gas (e.g., helium gas) to circulate through inlet 215-1 and outlet 215-2. The arrows at inlet 215-1 and outlet 215-2 indicate the directions of the gas flow. In some embodiments, base structure 214 includes a bottom portion 216 that seals gas tunnel 215 between inlet 215-1 and outlet 215-2. Other structures/devices between ESC structure 210 and base structure 214 are not shown in the figures for simplicity. In some embodiments, the wafer-holder structure exhibited in FIGS. 2A and 2B can be housed in a chamber (e.g., a dry etch chamber).

Base platen 211 can have a mounting surface Where an object (e.g., wafer W) can be attracted to and placed on. Base platen 211 can include a suitable insulating material, such as aluminum oxide ($Al_2O_3$/alumina) and/or aluminum nitride (AlN). Base platen 211 can have any suitable dimensions. For example, base platen 211 can have a thickness of about 1 μm to about 30 μm along the z axis, and the diameter of base platen 211 can be about 6 inches, about 8 inches, or other values suitable to hold wafers to be processed.

Electrode 209 can be in the shape of a thin film, embedded in base platen 211. Electrode 209 can have a monopolar shape or a bipolar shape. Electrode 209 can be connected to a power supply (inside or outside of the wafer-holder structure, not shown in the figures) so that a voltage can be applied to electrode 209 by the power supply. Coulomb force can be generated between ESC structure 210 and wafer W. Wafer W can then be attracted on the mounting surface of base platen 211. The magnitude of the voltage can be proportional to the coulomb force that attracts wafer W. Electrode 209 can include a suitable conductive material, such as tungsten, molybdenum, etc.

Heat generating component 212 can be connected to a power supply (inside or outside of wafer-holder structure, not shown in the figures) to generate heat when a voltage is applied to heat generating component 212. Heat generating component 212 can heat base platen 211 to a desired temperature, e.g., between about 100 degrees Celsius and about 300 degrees Celsius. Heat generating component 212 can include suitable materials of sufficiently low specific heat capacity, such as metals copper (Cu), tungsten (W), and/or nickel (Ni)). Heat generating component 212 can be uniformly distributed in heat insulating component 213 and have suitable dimensions. For example, heat generating component 212 can have a thickness of about 5 μm to about 100 μm.

Heat insulating component 213 can include an insulating material to cover heat generating component 212. Heat insulating component 213 can include a suitable insulating material, such as an insulating resin (e.g., polyimide, low-melting-point glass, alumina and/or silica). A thermal expansion coefficient of heat insulating component 213 can be similar or comparable to a thermal expansion coefficient of base platen 211. Heat insulating component 213 can have any suitable length along the z axis. For example, heat insulating component 213 can have a thickness of about 30 μm to about 1 cm.

Base structure 214 can provide support to ESC structure 210. Base structure 214 can include materials of sufficient stiffness and corrosion resistance, such as aluminum. A protection coating, e.g., an alumite layer. Base structure 214 can include a cooling component that can adjust the temperature of the mounting surface of base platen 211. The cooling component can include a gas tunnel 215. A heat transfer gas can circulate in gas tunnel 215 through inlet 215-1 and outlet 215-2. A bottom portion 216 can seal the heat transfer gas between inlet 215-1 and outlet 215-2. The arrows indicate the directions of the gas flow. The heat transfer gas can include any suitable gas, such as helium. The cooling component can also include gas passages (not shown in the figures) that connect gas tunnel 215 to the mounting surface of base platen 211 (e.g., under wafer W) so the heat transfer gas can cool the surface temperature of base platen 211, thus adjusting the processing temperature of wafer W. Optionally, the cooling component can include a fluid passage that allows a heat transfer fluid to circulate around/under heat insulating component 213 and to adjust the surface temperature of base platen 211. The fluid can include, e.g., water. For ease of viewing, the fluid passage is not shown in the figures.

ESC structure 210 can include a gas passage 218 under an outer sidewall of ESC structure 210. A plurality of gas holes (or through holes) 220 that connect gas passage 218 and a background gas of ESC structure 210 can be formed through the outer sidewall. The background gas of ESC structure 210 can include any gas in a chamber that houses ESC structure 210. In some embodiments, the background gas can include any gas that is between ESC structure 210 and a chamber that houses ESC structure 210. Gas passage 218 and the plurality of gas holes 220 can allow an inert gas to flow from a gas source and exit from the outer sidewall of ESC structure 210. The released inert gas can form a gas curtain that surrounds ESC structure 210 and prevents deflected radicals from colliding with the outer sidewall of ESC structure 210.

As shown in FIGS. 2A and 2B, in some embodiments, gas passage 218 can extend from the bottom of ESC structure 210 and extend vertically (e.g., along the z axis) to a desired elevation (e.g., a level at which the material of the outer sidewall is less susceptible to radical bombardment and erosion). Gas passage 218 can extend vertically along a periphery (e.g., under the outer sidewall) of ESC structure 210. A length of gas passage 218 along the z axis can be sufficiently equal to or smaller than the height of ESC structure 210 along the z axis. Gas passage 218 can separate (e.g., divide) ESC structure 210 to a sidewall portion 221 (e.g., formed with gas holes 220 and between the background gas and gas passage 218) and an inner portion 223 (e.g., electrode 209, heating component 212, portions of base platen 211 that covers electrode 209, and portions of heat insulating component 213 that covers heating component 212). As shown in FIG. 2B, in some embodiments, gas passage 218 surrounds inner portion 223, and sidewall portion 221 surrounds gas passage 218. The cross-section of inner portion 223 along the x-y plane can have any suitable shape such as a circular shape, a polygonal shape, a square shape, or an irregular shape. As shown in FIG. 2B, in some embodiments, inner portion 223 has a circular shape, gas passage 218 has a ring shape and surrounds inner portion 223 along the x-y plane, and sidewall portion 221 has a ring shape and surrounds inner portion 223 along the x-y plane. Gas holes 220 can be distributed along the direction that sidewall portion 221 extends in the x-y plane.

Sidewall portion 221 and inner portion 223 can be connected to or separated from one another. For example, when the height of ESC structure 210 is equal to the height of gas passage 218 along the z axis, sidewall portion 221 can be disconnected from inner portion 223. When the height of ESC structure 210 is smaller than the height of gas passage 218 along the z axis, sidewall portion 221 can be connected to inner portion 223 (e.g., as shown in FIG. 2A). A thickness d3 of sidewall portion 221 can be in a range of about 0.1 mm to about 0.2 mm. In some embodiments, d3 is about 0.1 mm. A distance d5 between two adjacent gas holes 220 along the z axis can be in a range of about 0.1 mm to about 0.2 mm. In some embodiments, d5 is about 0.1 mm.

Gas passage 218 can surround inner portion 223 of ESC structure 210 from various directions. In some embodiments, gas passage 218 can continuously surround inner portion 223 from all directions along the x-y plane, as shown in FIG. 2B. In some embodiments, gas passage 218 surrounds a portion of inner portion 223. In some embodiments, gas passage 218 includes a plurality of gas sub-passages, each surrounding inner portion 223 from a different direction. Each gas sub-passage can be connected to a same or different inert gas source through a sub-inlet of the gas sub-passage. In some embodiments, gas passage 218 is located at the side of the outer sidewall that may be the most susceptible to radical erosion. The specific arrangement of gas passages can be determined based on, e.g., the distribution/pattern of the radical damage and/or design requirements for the ESC structure and should not be limited by the embodiments of the present disclosure.

In some embodiments, gas passage 218 can also extend along the periphery of base structure 214. Gas passage 218 can extend horizontally (e.g., along the x-y plane) and vertically (e.g., along the z axis). In some embodiments, gas passage 218 separates (e.g., divides) base structure 214 into a base inner portion (e.g., surrounded by gas passage 218) and a base sidewall portion 222 (e.g., between the background gas and gas passage 218). In some embodiments, gas holes 220 are formed through base sidewall portion 222. The distribution, pattern, and/or shapes of gas holes 220 formed in base sidewall portion 222 can be the same as or similar to the distribution, pattern, and/or shapes of gas holes 220 formed in sidewall portion 221 of ESC structure 210.

A plurality of gas holes 220 can be formed connecting gas passage 218 and the background gas of ESC structure 210. Gas holes 220 can be distributed/aligned horizontally (e.g., along the x-y plane) in any suitable pattern and have horizontal exit directions to allow an inert gas to exit horizontally. In some embodiments, gas holes 220 are distributed uniformly on the outer sidewall of ESC structure 210. Gas holes 220 can have any suitable shape. In some embodiments, gas holes 220 can each have a circular cross-sectional shape along the y-z plane and a diameter d1 of gas hole 220 is in a range of about 0.05 min to about 0.5 mm. In some embodiments, d1 is about 0.1 mm. A width d2 of gas passage 218 can be in a range of about 0.1 mm to about 0.2 mm. In some embodiments, width d2 is about 0.1 mm. In some embodiments, ESC structure 210 has a circular cross-sectional shape along the x-y plane and an arc length d4 between the geometric centers of two adjacent gas holes 220 along the x-y plane is in a range of about 0.1 mm to about 0.2 mm. In some embodiments, arc length d4 is about 0.1 mm.

An inert gas can be flown in to gas passage 218 from a gas source, through inlets 219 at the bottom of gas passage 218 and can exit from gas holes 220. Directions of gas flow of the inert gas are indicated by the arrows. The inert gas can include any suitable gas that is chemically stable under the processing condition in the chamber. For example, the inert gas can include nitrogen. The flow rate of the inert gas can be in a range of about 20 to about 200 standard cubic centimeter per minute (sccm). In some embodiments, the flow rate is about 50 sccm.

The inert gas exiting from gas holes 220 can form a gas curtain along the outer sidewall of ESC structure 210. In some embodiments, the atoms of the inert gas in the gas curtain can collide with deflected radicals (not shown in FIG. 2A) and thus form a barrier for the deflected radicals. Less or no deflected radicals can reach the outer sidewall of ESC structure 210. The outer sidewall of ESC structure 210 is thus less susceptible to bombardment and/or erosion of the deflected radicals.

Inlet 219 can be located at any suitable position of gas passage 218 and an inert gas can be flown into gas passage 218 from an inert gas source. For example, inlet 219 can be located at the bottom (e.g., as shown in FIG. 2A) of the wafer-holder structure and/or between the top and the bottom of the wafer-holder structure. Inlet 219 can also include a plurality of sub-inlets for flowing the inert gas into gas passage 218 from various directions. The arrangement of inlets 219 can be determined based on, e.g., the ease of manufacturing and/or the design requirement of the wafer-holder structure, and should not be limited by the embodiments of the present disclosure.

In some embodiments, gas holes 220 and 222 are distributed uniformly along the x-y plane and/or z direction. In some embodiments, the distribution of gas holes 220 and 222 are based on the damage levels. For example, sidewall portion 221 of ESC structure 210 is more susceptible to radical damage than the base sidewall portion and can thus be formed with more gas holes 220. In some embodiments, no gas passage or gas holes are formed in base structure 214.

Figure 3A:
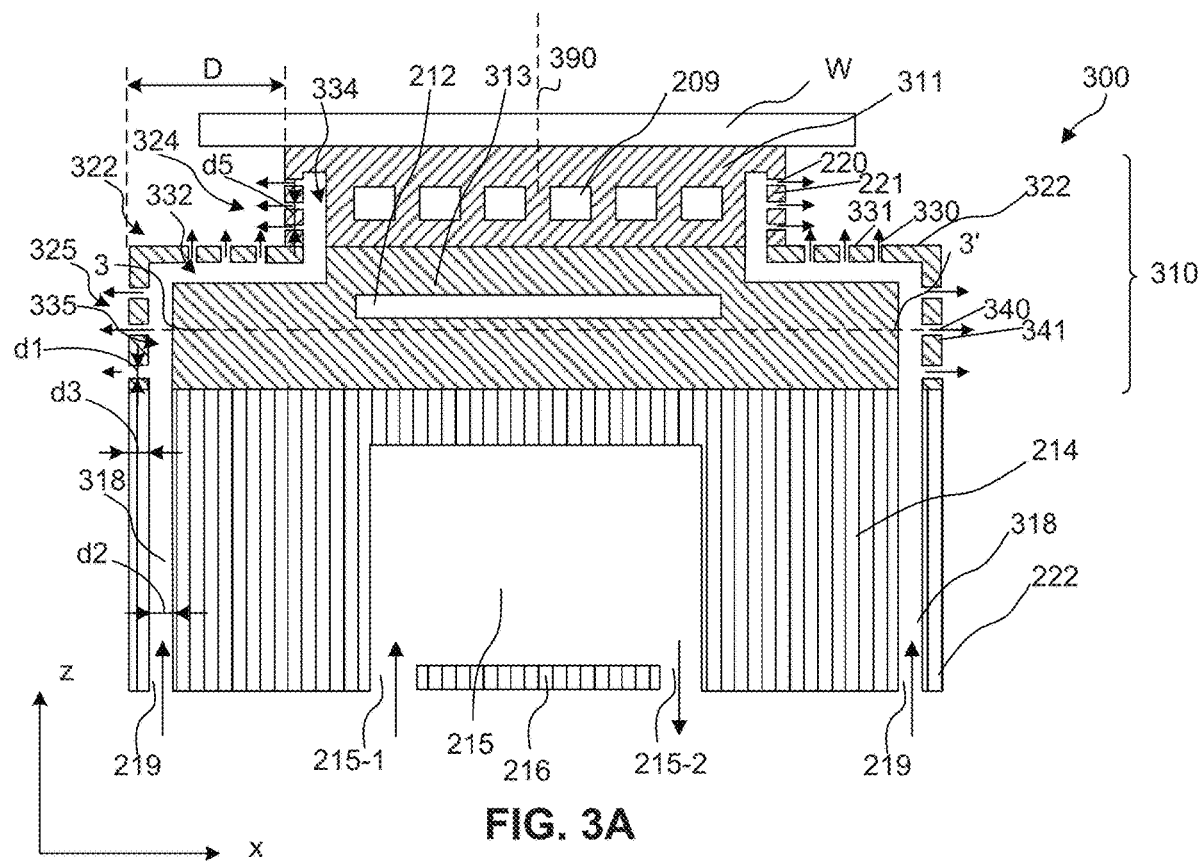
Figure 3B:
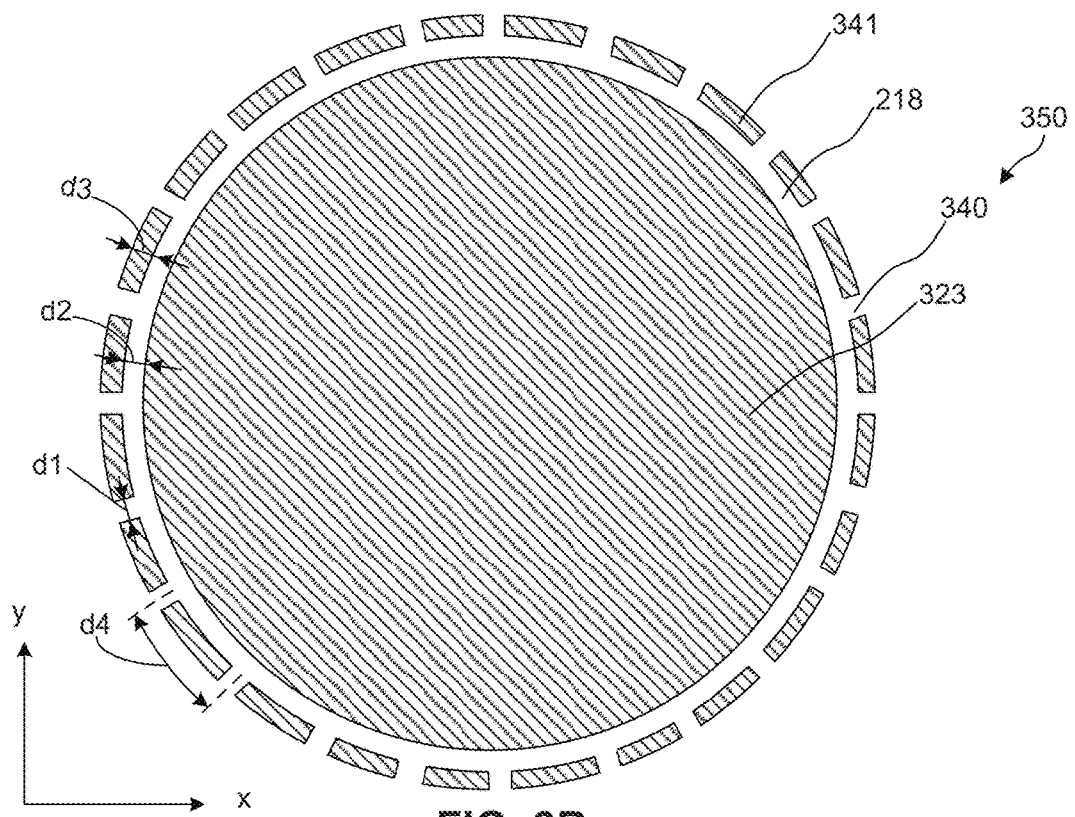
FIG. 3B is a top view of the electrostatic chuck structure illustrated in FIG. 3A along the 3-3' direction.

FIGS. 3A and 3B illustrate another wafer-holder structure, according to some embodiments. FIG. 3A illustrates a cross-sectional view 300 of the wafer-holder structure along the x-z plane, and FIG. 3B illustrates a top view 350 of the wafer-holder structure along the 3-3' direction along the x-y plane. The wafer-holder structure of FIGS. 3A and 3B includes a horizontal surface (e.g., along the x axis) and a gas passage that can be formed under the horizontal surface. Gas holes can be formed through the horizontal surface to connect the gas passage to the background gas. The horizontal surface can be a part of the ESC structure or a part of the base. For illustrative purposes, elements labeled with the same/similar numerals in FIGS. 3A and 3B as in FIGS. 2A and 2B can be the same or similar, in which the description of these elements can be found above. Further, the discussion of the wafer-holder structure in FIGS. 2A and 2B (e.g., benefits of a gas curtain, and background gas) can be applied to that in FIGS. 3A and 3B unless mentioned otherwise. As shown in FIG. 3A, base platen 311 and heat insulating component 313 can be similar to base platen 211 and heat insulating component 213, and the cross-sectional area of base platen 311 can be different from the cross-sectional area of heat insulating component 313 along the x-y plane.

in some embodiments, gas passage 318 separates (e.g., divides) ESC structure 310 into an inner portion 323 and a sidewall portion. As shown in FIGS. 3A and 3B, the sidewall portion of ESC structure 310 can include a horizontal sidewall portion 322 (e.g., along the x axis). In some embodiments, the outer sidewall of ESC structure 310 includes horizontal sidewall portion 322 and two vertical sidewall portions 324 and 325 (e.g., along the z axis) each connected to horizontal sidewall portion 322 at a different end. Vertical sidewall portion 324 can be connected to horizontal sidewall portion 322 and the top of base platen 311. Vertical sidewall portion 325 can be connected to horizontal sidewall portion 322 and the bottom of heat insulating component 313. Gas passage 318 can extend under horizontal sidewall portion 322 and at least one of vertical sidewall portions 324 and 325. In some embodiments, gas passage 318 extends under horizontal sidewall portion 322 and vertical sidewall portions 324 and 325. In some embodiments, gas passage 318 includes a horizontal passage portion 332 under horizontal sidewall portion 322. Gas passage 318 can include at least one vertical passage portions connected to horizontal passage portion 332. In some embodiments, gas passage 318 includes two vertical passage portions 334 (e.g., under vertical sidewall portion 324) and 335 (e.g., under vertical sidewall portion 325), each connected to horizontal passage portion 332. The total height along the z axis) of vertical passage portions 334 and 335 can be substantially equal to or smaller than the total height (e.g., along the z axis) of base platen 211 and heat insulating component 213. Gas holes 330 can be formed at least through horizontal sidewall portion 322, connecting horizontal passage portion 332 and the background gas. In some embodiments, gas holes 220 are formed through vertical sidewall portion 221, and/or gas holes 340 are formed through vertical sidewall portion 341. FIG. 3B illustrates cross-section view 350 of inner portion 323 along the 3-3' direction. Inner portion 323 can be similar to or the same as inner portion 223 illustrated in FIG. 2B. In some embodiments, inner portion 323 has a circular shape, gas passage 318 has a ring shape and surrounds inner portion 323 along the x-y plane, and vertical sidewall portion 341 has a ring shape and surrounds inner portion 323 along the x-y plane,. Gas holes 340 can be distributed along the direction that vertical sidewall portion 341 extends in the x-y plane.

A gas source can be connected to inlet 219 of gas passage 318 to flow an inert gas into gas passage 318. The inert gas can exit from the gas holes 330, 220 and/or 340). Directions of gas flow and positions of the gas curtain are indicated by the arrows. Gas holes 330 can have vertical exit directions to allow the inert gas to exit vertically from gas holes 330. In some embodiments, inert gas exiting vertically from gas holes 330 can enhance the gas curtain (e.g., surrounding the upper portion, above horizontal sidewall portion 322, of ESC structure 310) exiting horizontally from gas holes 220 to prevent or reduce deflected radicals from reaching the outer sidewalk of ESC structure 310. In some embodiments, the inert gas exiting from gas holes 340 also forms a gas curtain that surrounds the lower portion (e.g., below horizontal sidewall portion 322) of ESC structure 310.

Horizontal sidewall portion 322 can be coplanar with, above, or under the interface between base platen 211 and heat insulating component 313. Horizontal sidewall portion 322 can have a suitable dimension. Horizontal sidewall portion 322 can be formed by the dimension difference between adjacent layers/structures, e.g., base platen 311 and heat insulating component 313 along the x-y plane or between insulating component 313 and base structure 214 along the x-y plane. The pattern, shape, and distribution of gas holes 220, 330, and 340 can be similar to or the same as the pattern, shape, and distribution of gas holes 220 of FIGS. 2A and 2B.

In some embodiments, gas passage 318 extends through base structure 214. The inert gas is flown into gas passage 318 through inlet 219 located at a bottom of base structure 214. Gas passage 318 can separate (e.g., divide) base structure 214 into a base sidewall portion (e.g., between gas passage 318 and the background gas) and a base inner portion (e.g., surrounded by gas passage 318). Gas holes may or may not be formed through the base sidewall portion. In some embodiments, as shown in FIGS. 3A and 3B, gas holes are not formed through the base sidewall portion. Details of passage 318 can be referred to the dimensions of passage 218 of FIGS. 2A and 2B.

In some embodiments, the pattern, distribution, dimensions, and/or shapes of the gas passages (e.g., in FIGS. 2A and 2B and FIGS. 3A and 3B) are determined based on various factors, such as the shapes and dimensions of the ESC structure and/or the base and the locations of the radical damage. For example, the pattern distribution of gas passage and the gas holes can be arranged to minimize the radical damage at a desired flow rate of the inert gas.

In some embodiments, the outer sidewall of an ESC structure (or a wafer-holder structure) includes sidewall portions that are arranged in various directions, and a gas passage is formed under one or more of the sidewall portions. In some embodiments, the ESC structure can include a first sidewall portion in a first direction and a second sidewall portion in a second direction different from the first direction. Each of the first and the second sidewall portions can have at least one gas hole configured to respectively exit the inert gas in the first and the second directions to form the gas curtain. The specific shape of the ESC structure should not be limited by the embodiments of the present disclosure.

The gas passage and gas holes can be formed by any suitable method. In some embodiments, the gas passage is formed by removing a peripheral portion of an ESC to form a sidewall portion and an inner portion. The sidewall portion and the inner portion can be separated by the gas passage. The gas holes can be formed by forming through holes in the sidewall portion. In some embodiments, the gas passage is formed by surrounding an ESC with a suitable material that has sufficient stiffness to block radical bombardment. The gas holes can be formed by forming through holes in the material.

It should be noted that, although the present disclosure describes gas holes with horizontal and/or vertical exit directions, the exit directions of gas holes can vary in different devices/applications, based on, e.g., the position and the distribution range of the gas curtain. For example, the exit directions of gas holes can be different from the horizontal direction and the vertical direction. In another example, the exit directions of gas holes in a vertical sidewall portion and the exit directions of gas holes in the adjacent horizontal sidewall portion can form angles less than or greater than about 90 degrees in the x-z plane (e.g., the angles formed by the intersections of the exit directions in a vertical sidewall portion and exit directions in the adjacent horizontal sidewall portion). The specific exit directions of gas holes should be determined based on, e.g., the ESC structure, the desired position and distribution range of the gas curtain, and the chamber pressure, and should not be limited by the embodiments of the present disclosure.

Figure 4:
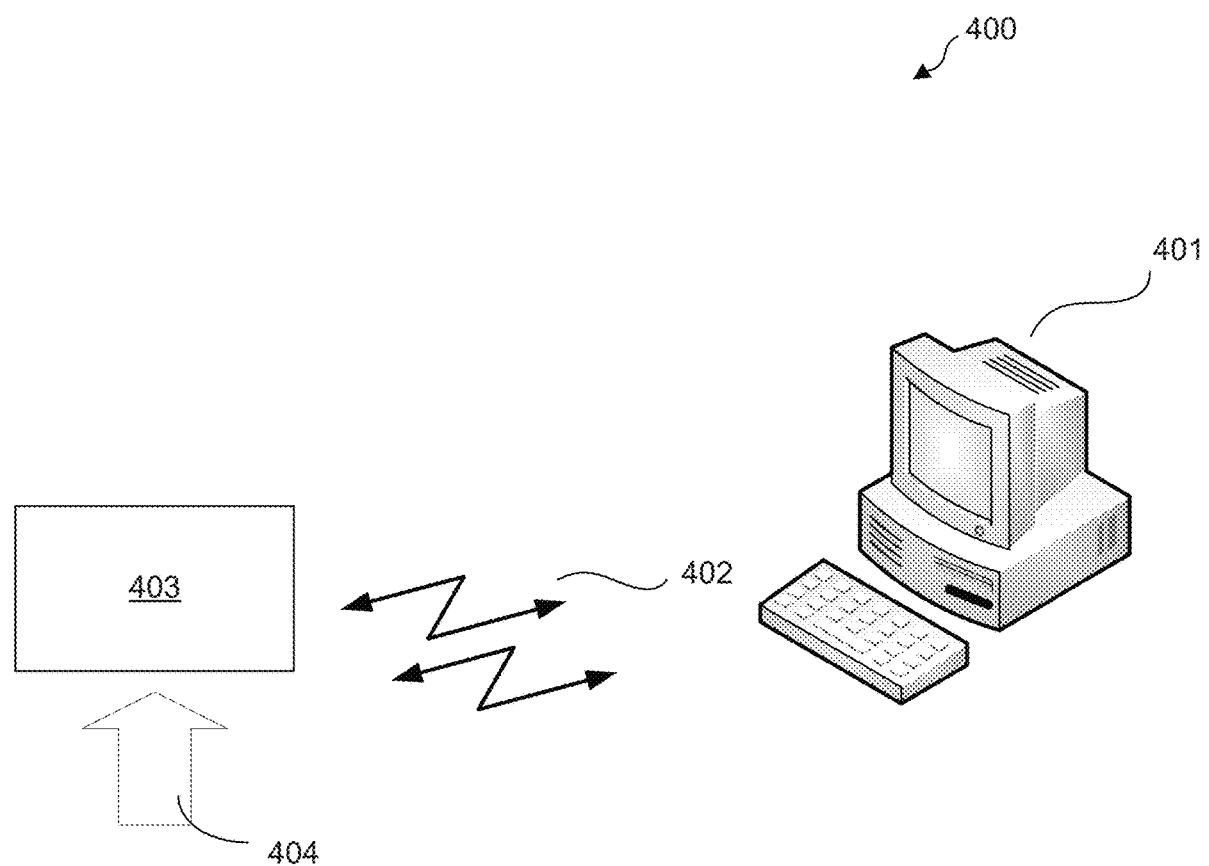
FIG. 4 illustrates a control system, according to some embodiments of the present disclosure.

FIG. 4 illustrates an system 400 using a wafer-holder structure of the present disclosure, according to some embodiments. As shown in FIG. 4, system 400 includes a control unit/device 401, a communication means 402, a wafer-holder structure 403 with a disclosed ESC structure, and an inert gas 404 flowing into wafer-holder structure 403.

Control unit/device 401 can include any suitable computer system (e.g., workstation and portable electronic device) to store programs and data for various operations, such as controlling the processing of a wafer placed over the wafer-holder structure and controlling a flow of inert gas 404 into wafer-holder structure 403. For example, flow rate, chamber pressure, start/end time of inert gas 404, and/or the type of inert gas 404 can be controlled by control unit/device 401. In some embodiments, control unit/device 401 includes programs that can determine the flow rate of inert gas 404 based on the power of an etch process. For example, a higher flow rate can be used for a higher power, and vice versa. In some embodiments, control unit/device 401 includes programs that automatically starts flowing inert gas 404 when the power is on. In some embodiments, control unit/device 401 include programs that determine the type of inert gas 404 to use based on different etchant gases. In some embodiments, control unit/device 401 transmits various control signals to control the wafer processing and formation of a gas curtain. The different functions of control unit/device 401 should be determined based on, e.g., the processing/etching of wafers and/or the chamber condition, and should not be limited by the embodiments of the present disclosure.

Communication means 402 can include any suitable network connection between control unit/device 401 and wafer-holder structure 403. For example, communication means 402 can include a local area network (LAN) and/or a WiFi network. In some embodiments, control unit/device 401 transmits control signals through communication means 402 to adjust/control the flow of inert gas 404 into the gas passage, and communication means 402 transmits the control signals to the chamber containing wafer-holder structure 403.

Wafer-holder structure 403 can be located in a chamber and can include any wafer-holder structure disclosed by the present disclosure. The chamber can include any suitable software and/or hardware to receive the implement the control signals. Wafer-holder structure 403 can include an ESC structure. The ESC structure can include a gas passage extending at least under the outer sidewall that is susceptible to damage caused by deflected radicals. Gas holes can be formed through the gas passage and connect the gas passage to the background gas so that an inert gas 404 can exit from the gas holes and form a gas curtain around the ESC structure. The gas curtain can be in the close proximity of the ESC structure and form a barrier that can prevent the deflected radicals from reaching the outer sidewall of the ESC structure. The flow rate, start/end time of inert gas 404, chamber pressure, and/or the type of inert gas 404 can be controlled by control unit/device 401.

By using the disclosed ESC structure (or wafer-holder structure), a gas curtain can be formed around the ESC structure and protect the ESC structure from damage to the outer sidewall caused by deflected radicals. As a result, wafer bowing due to static electricity can be reduced or prevented. The gas passage and gas holes that form the gas curtain can be used in ESC structures of different shapes and dimensions. Because the inert gas that forms the gas curtain is chemically stable during wafer processing (e.g., etching) and the gas curtain is sufficiently close to the outer sidewall of the ESC structure, the impact of the gas curtain on wafer processing can be minimized.

Figure 5:
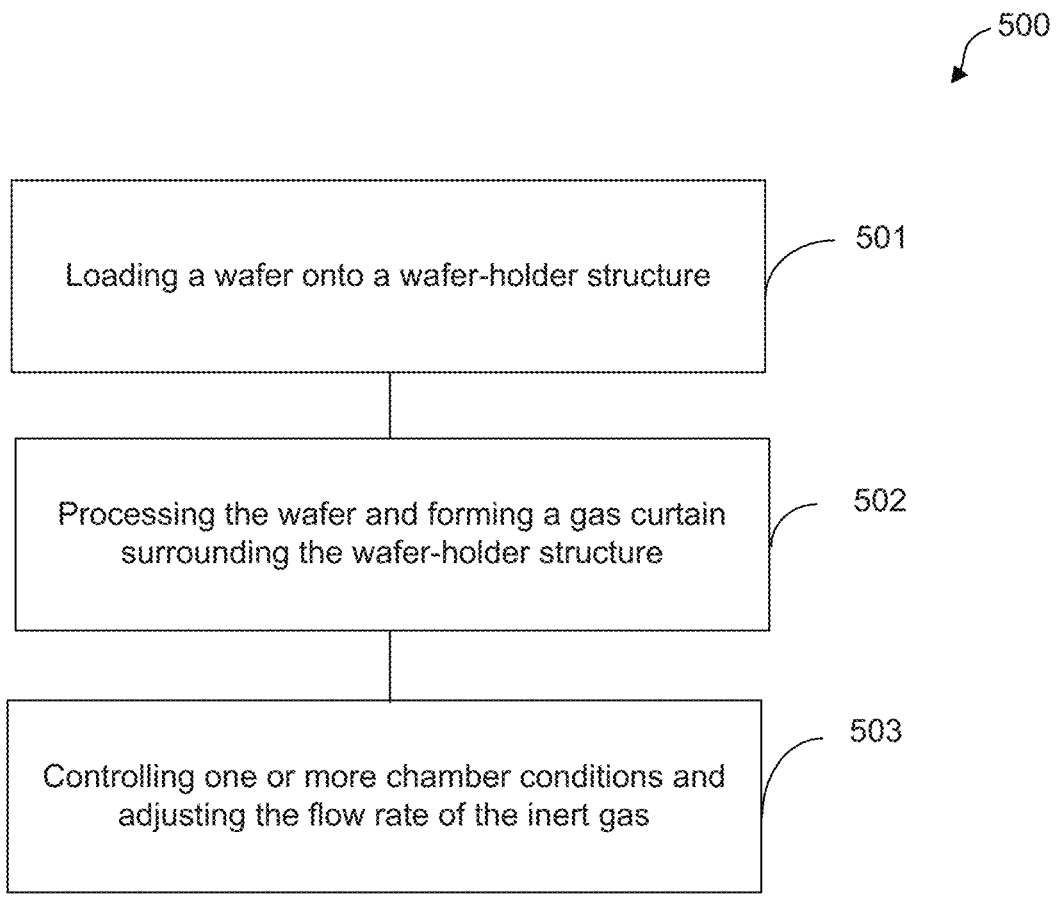
FIG. 5 illustrates a method for protecting an electrostatic chuck structure from damage by deflected radicals, according to some embodiments of the present disclosure.

FIG. 5 illustrates a method for protecting an electrostatic chuck structure from damage by deflected radicals, according to some embodiments. In some embodiments, the operations of method 500 can be performed in a different order. Variations of method 500 are within the scope of the present disclosure.

At operation 501, a wafer can be loaded onto a wafer-holder structure in a chamber. The wafer-holder structure can include any one of the wafer-holder structures of the present disclosure. The wafer-holder structure can attract and fix the wafer on the mounting surface of the wafer-holder structure.

At operation 502, the wafer can be processed and a gas curtain can be formed to surround the wafer-holder structure. The gas curtain can be formed by flowing an inert gas into the gas passage so that the inert gas can exit from the gas holes. In some embodiments, the processing of the wafer is controlled by a control unit/device. Various sensors, such as a pressure sensor and a temperature sensor, can be used to monitor chamber conditions so the control unit/device can control the wafer processing on a real-time basis. The control unit/device can control different variables such as the chamber pressure, the flow rate of the etchants, the power applied on the plasma, the processing temperature, etc. Also, the control unit/device flows an inert gas into the gas passage of the wafer-holder structure during wafer processing (e.g., after the plasma is formed). The inert gas can exit from the gas holes that connect the gas passage to the background gas, in which the inert gas forms a gas curtain around the wafer-holder structure. The gas curtain can prevent or reduce deflected radicals (e.g., from the plasma etching process) from reaching the outer sidewall of the wafer-holding structure.

At operation 503, one or more chamber conditions can be controlled and the flow rate of the inert gas can be adjusted based on the chamber conditions. The control unit/device can monitor the chamber conditions (e.g., chamber pressure) based on feedback information provided by sensors (e.g., temperature and pressure sensors) and adjust the chamber conditions accordingly. For example, if the inert gas causes the chamber pressure to deviate from the predetermined processing parameters, the control unit/device can adjust the flow rate of the inert gas so that the chamber pressure reaches the predetermined chamber pressure. In some embodiments, operation 503 can periodically monitor chamber conditions to ensure that the predetermined processing parameters are achieved.

Figure 6:
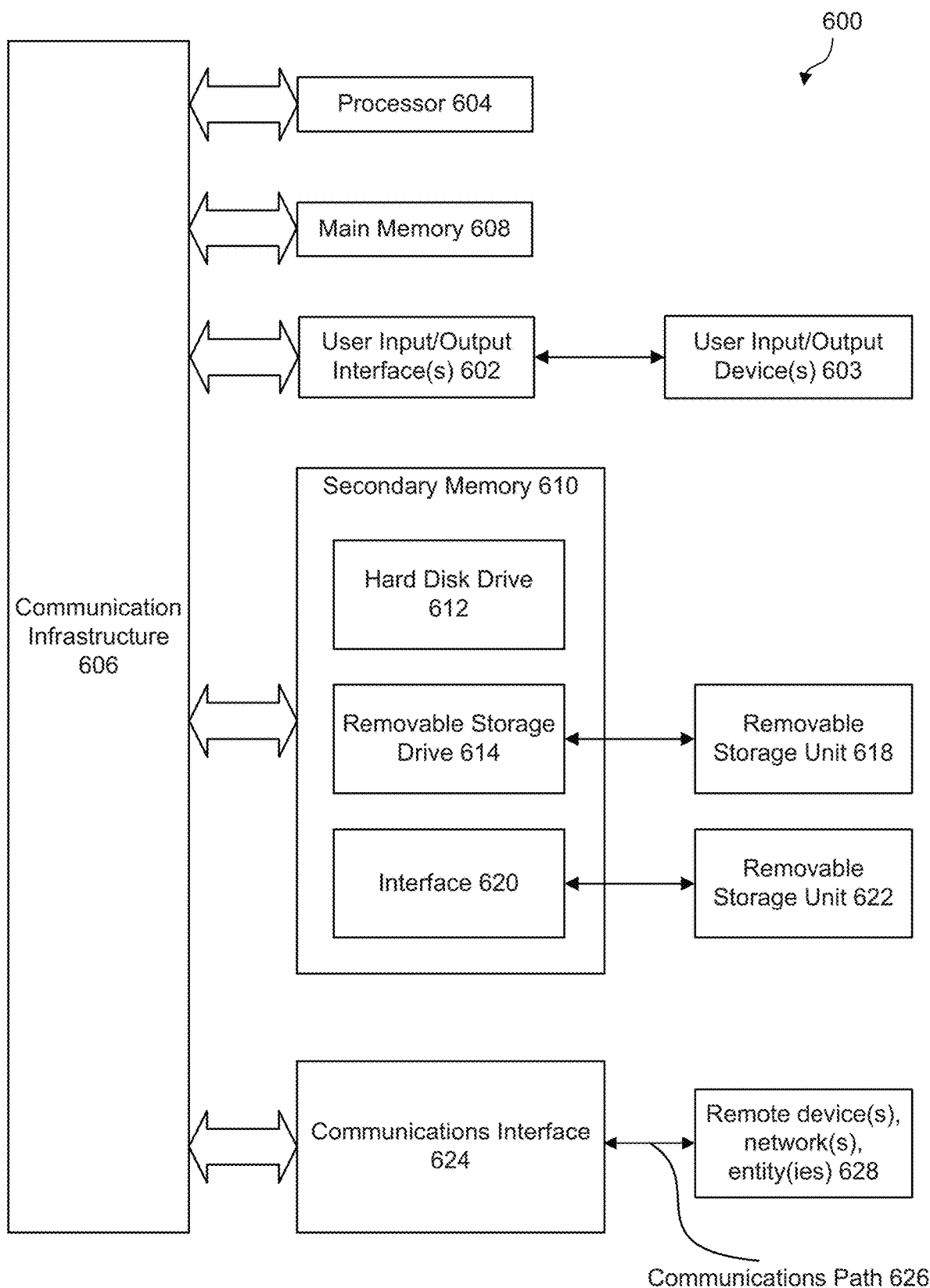
FIG. 6 illustrates an exemplary computer system for implementing various embodiments of the present disclosure.

FIG. 6 is an illustration of an example computer system 600 in which various embodiments of the present disclosure can be implemented, according to some embodiments. Computer system 600 can be used, for example, in control unit/device 401 of FIG. 4. Computer system 600 can be any well-known computer capable of performing the functions and operations described herein. For example, and without limitation, computer system 600 can be capable of processing and transmitting signals. Computer system 600 can be used, for example, to control the flowing of inert gas into the gas passage.

Computer system 600 includes one or more processors (also called central processing units, or CPUs), such as a processor 604. Processor 604 is connected to a communication infrastructure or bus 606. Computer system 600 also includes input/output device(s) 603, such as monitors, keyboards, pointing devices, etc., that communicate with communication infrastructure or bus 606 through input/output interface(s) 602. A control tool can receive instructions to implement functions and operations described herein—e.g., the functions of system 400 described in FIG. 4 and the method/process described in FIG. 5—via input/output device(s) 603. Computer system 600 also includes a main or primary memory 608, such as random access memory (RAM). Main memory 608 can include one or more levels of cache. Main memory 608 has stored therein control logic (e.g., computer software) and/or data. In some embodiments, the control logic (e.g., computer software) and/or data can include one or more of the functions described above with respect to the previously discussed wafer-holder structure (e.g., wafer-holder structure 100, 200/250, 300/350, or 403). In some embodiments, processor 604 can be configured to execute the control logic stored in main memory 608.

Computer system 600 can also include one or more secondary storage devices or memory 610. Secondary memory 610 can include, for example, a hard disk drive 612 and/or a removable storage device or drive 614. Removable storage drive 614 can be a floppy disk drive, a magnetic tape drive, a compact disk drive, an optical storage device, tape backup device, and/or any other storage device/drive.

Removable storage drive 614 can interact with a removable storage unit 618. Removable storage unit 618 includes a computer usable or readable storage device having stored thereon computer software (control logic) and/or data. Removable storage unit 618 can be a floppy disk, magnetic tape, compact disk, DVD, optical storage disk, and/any other computer data storage device. Removable storage drive 614 reads from and/or writes to removable storage unit 618 in a well-known manner.

According to some embodiments, secondary memory 610 can include other means, instrumentalities or other approaches for allowing computer programs and/or other instructions and/or data to be accessed by computer system 600. Such means, instrumentalities or other approaches can include, for example, a removable storage unit 622 and an interface 620. Examples of the removable storage unit 622 and the interface 620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 610, removable storage unit 618, and/or removable storage unit 622 can include one or more of the functions described above with respect to the previously discussed wafer-holder structure.

Computer system 600 can further include a communication or network interface 624. Communication interface 624 enables computer system 600 to communicate and interact with any combination of remote devices, remote networks, remote entities, etc. (individually and collectively referenced by reference number 628). For example, communication interface 624 can allow computer system 600 to communicate with remote devices 628 over communications path 626, which can be wired and/or wireless, and which can include any combination of LANs, WANs, the Internet, etc. Control logic and/or data can be transmitted to and from computer system 600 via communication path 626.

The functions/operations in the preceding embodiments can be implemented in a wide variety of configurations and architectures. Therefore, some or all of the operations in the preceding embodiments—e.g., the functions of system 400 described in FIG. 4 and the method/process described in FIG. 5—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein. For example, the hardware/equipment can be connected to or be part of element 628 (remote device(s), network(s), entity(ies) 628) of computer system 600.

In some embodiments, an apparatus includes a chuck for placing an object thereon, a gas passage extending along a periphery of an outer sidewall of the chuck and dividing the chuck into an inner portion and a sidewall portion, and a plurality of gas holes through the sidewall portion and configured to connect the gas passage to a gas external to the chuck.

In some embodiments, a method includes loading a wafer onto a wafer-holder structure, performing one or more operations on the wafer, and forming a gas curtain that surrounds an outer sidewall of the wafer-holder structure.

In some embodiments, a system includes a chamber and a control device. The chamber can include a wafer-holder structure that includes a chuck for placing an object thereon, and a gas passage extending along a periphery of an outer sidewall of the chuck. The gas passage can divide the chuck into an inner portion and a sidewall portion. The wafer-holder structure can also include a plurality of gas holes through the sidewall portion and configured to connect to a gas external to the wafer-holder structure to the gas passage. The gas passage can be configured to allow an inert gas to flow through the plurality of gas holes to form a gas curtain that surrounds the outer sidewall of the chuck. The control device can be configured to control one or more operations in the chamber and the gas curtain along the outer sidewall of the chuck.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
   forming a plasma in a chamber;
   flowing an inert gas through a ring-shape portion of a gas passage in a wafer-holder structure in the chamber; and
   outputting a portion of the inert gas from a sidewall of the wafer-holder structure and towards a vertical direction.

2. The method of claim 1, further comprising outputting another portion of the inert gas from the sidewall of the wafer-holder structure and towards a horizontal direction.

3. The method of claim 1, wherein flowing the inert gas into the wafer-holder structure comprises flowing the inert gas in a horizontal portion of the gas passage in the wafer-holder structure.

4. The method of claim 1, further comprising forming a gas curtain between the plasma and the sidewall of the wafer-holder structure.

5. The method of claim 1, further comprising adjusting a flow rate of the inert gas according to a temperature of the chamber.

6. The method of claim 1, further comprising adjusting a flow rate of the inert gas according to a pressure of the chamber.

7. The method of claim 1, further comprising:
   loading a wafer onto the wafer-holder structure; and
   processing the wafer using the plasma.

8. An apparatus, comprising:
   a wafer-holder structure configured to hold a wafer and to output a gas through a plurality of gas holes on a sidewall of the wafer-holder structure;
   a base structure connected to the wafer-holder structure; and
   a gas passage through the base structure, wherein a portion of the gas passage has a ring-shaped cross section and is connected to the plurality of gas holes, and wherein the gas passage comprises a horizontal portion.

9. The apparatus of claim 8, wherein the plurality of gas holes are configured to output the gas in a horizontal direction.

10. The apparatus of claim 8, wherein the plurality of gas holes are configured to output the gas in a vertical direction.

11. The apparatus of claim 8, further comprising an inlet connected to the gas passage at a bottom of the base structure and configured to receive an inert gas source.

12. The apparatus of claim 8, wherein a diameter of the plurality of gas holes is in a range of about 0.05 mm to about 0.5 mm.

13. The apparatus of claim 12, wherein the diameter is about 0.1 mm.

14. The apparatus of claim 8, wherein the plurality of gas holes are distributed uniformly on the sidewall of the wafer-holder structure.

15. A system, comprising:
   a chamber configured to form a plasma to process a wafer;
   a wafer-holder structure, in the chamber, configured to hold the wafer and to output an inert gas through a plurality of gas holes on a sidewall of the wafer-holder structure;
   a base structure connected to the wafer-holder structure;
   a gas passage through the base structure and connected to the plurality of gas holes, wherein a ring-shaped portion of the gas passage is enclosed by the sidewall; and
   a control device configured to control a flow rate of the inert gas in the gas passage.

16. The system of claim 15, further comprising a sensor configured to monitor a pressure of the chamber, wherein the control device is further configured to adjust the flow rate according to the pressure of the chamber.

17. The system of claim 15, wherein the gas passage comprises a horizontal portion.

18. The system of claim 15, wherein the plurality of gas holes are configured to output the inert gas in a horizontal direction.

19. The system of claim 15, wherein the base structure comprises another plurality of gas holes on a sidewall of the base structure and connected to the gas passage.

20. The system of claim 15, further comprising an inlet connected to the gas passage at a bottom of the base structure and configured to receive an inert gas source.

* * * * *